United States Patent
Ko et al.

(10) Patent No.: US 11,189,681 B2
(45) Date of Patent: Nov. 30, 2021

(54) ORGANIC LIGHT EMITTING DIODE DISPLAY AND MANUFACTURING METHOD THEREOF

(71) Applicant: Samsung Display Co., Ltd., Yongin-Si (KR)

(72) Inventors: Kyeong Su Ko, Hwaseong-si (KR); Joon Geol Lee, Jeollabuk-do (KR); Shin Il Choi, Hwaseong-si (KR); Sang Gab Kim, Seoul (KR); Hyun Min Cho, Hwaseong-si (KR); Hyun Eok Shin, Gwacheon-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/409,991

(22) Filed: May 13, 2019

(65) Prior Publication Data
US 2020/0075707 A1   Mar. 5, 2020

(30) Foreign Application Priority Data
Sep. 3, 2018   (KR) .................. 10-2018-0104793

(51) Int. Cl.
| H01L 51/05 | (2006.01) |
| H01L 51/00 | (2006.01) |
| H01L 27/32 | (2006.01) |
| H01L 51/56 | (2006.01) |

(52) U.S. Cl.
CPC ...... *H01L 27/3276* (2013.01); *H01L 51/0018* (2013.01); *H01L 51/055* (2013.01); *H01L 51/56* (2013.01)

(58) Field of Classification Search
CPC ............ H01L 27/3276; H01L 51/0018; H01L 51/0055; H01L 51/56
USPC ...................................... 257/40, 72
See application file for complete search history.

(56) References Cited

U.S. PATENT DOCUMENTS

| 4,651,185 A | 3/1987 | Holmberg et al. |
| 5,582,679 A | 12/1996 | Lianjun et al. |
| 5,670,795 A | 9/1997 | Ikeda |
| 6,646,287 B1 * | 11/2003 | Ono .................. H01L 29/42384 257/66 |
| 8,735,889 B2 | 5/2014 | Yamazaki et al. |

(Continued)

FOREIGN PATENT DOCUMENTS

| JP | 2009-200355 A | 9/2009 |
| KR | 10-0687869 B1 | 2/2007 |

(Continued)

OTHER PUBLICATIONS

Masatoshi Oda and Kazuo Hirata, "Undercutting Phenomena in Al Plasma Etching", Japanese Journal of Applied Physics vol. 19, No. 7, Jul. 1980 pp. L405-L408, 4 pages.

*Primary Examiner* — David Vu
*Assistant Examiner* — Brandon C Fox
(74) *Attorney, Agent, or Firm* — Innovation Counsel LLP

(57) ABSTRACT

An OLED display according to an exemplary embodiment includes: a substrate; a gate insulation layer that is disposed on the substrate; and a gate wire that is disposed on the gate insulation layer, and includes a gate electrode, wherein the gate wire includes a single layer of aluminum or an aluminum alloy, and an angle formed by side surfaces of the gate wire and the gate insulation layer is less than 65°.

13 Claims, 13 Drawing Sheets

(56) References Cited

U.S. PATENT DOCUMENTS

| | | | | |
|---|---|---|---|---|
| 2006/0255719 A1* | 11/2006 | Oikawa | ............ | H05B 33/10 |
| | | | | 313/503 |
| 2010/0244036 A1* | 9/2010 | Park | ............ | H01L 29/42384 |
| | | | | 257/72 |
| 2015/0206982 A1* | 7/2015 | Moon | ............ | H01L 27/124 |
| | | | | 257/72 |
| 2016/0013072 A1* | 1/2016 | Sera | ............ | H01L 21/32135 |
| | | | | 257/751 |
| 2016/0336419 A1* | 11/2016 | Oh | ............ | H01L 27/1222 |
| 2018/0366526 A1* | 12/2018 | Lee | ............ | H01L 27/1251 |

FOREIGN PATENT DOCUMENTS

| | | |
|---|---|---|
| KR | 10-1407661 B1 | 6/2014 |
| KR | 10-1741732 B1 | 5/2017 |

\* cited by examiner

ORGANIC LIGHT EMITTING DIODE DISPLAY AND MANUFACTURING METHOD THEREOF

CROSS-REFERENCE TO RELATED APPLICATION

This application claims priority to and the benefit of Korean Patent Application No. 10-2018-0104793 filed in the Korean Intellectual Property Office on Sep. 3, 2018, the entire contents of which are incorporated herein by reference.

BACKGROUND (a) Field

The present disclosure relates to an organic light emitting diode (OLED) display and a manufacturing method thereof.

(b) Description of the Related Art

An organic light emitting diode (OLED) of an organic light emitting diode (OLED) display includes two electrodes and an organic emission layer that is disposed between the two electrodes, and an electron injected from a cathode, which is one electrode, and holes injected from an anode, which is the other electrode, are combined in the organic emission layer to form an exciton, and the exciton emits light while emitting energy.

As the technology for the OLED display has been developed, the OLED display has become larger in size and higher in resolution. Accordingly, a problem such as a signal delay or a voltage drop may occur, and in order to solve the problem, the OLED display needs to be driven at a high speed.

The above information disclosed in this Background section is only for enhancement of understanding of the background of the inventive concept and therefore it may contain information that does not form the prior art that is already known in this country to a person of ordinary skill in the art.

SUMMARY

Exemplary embodiments of the present inventive concept provide an organic light emitting diode (OLED) display that can be prevented from being damaged during a manufacturing process, and implement high-resolution and high-speed driving, and a method for manufacturing the same.

An OLED display according to an exemplary embodiment includes: a substrate; a gate insulation layer that is disposed on the substrate; and a gate wire that is disposed on the gate insulation layer, and includes a gate electrode, wherein the gate wire includes a single layer of aluminum or an aluminum alloy, and an angle formed by side surfaces of the gate wire and the gate insulation layer is less than 65°.

The gate insulation layer may include a silicon oxide or a silicon nitride.

The OLED display may further include: a semiconductor layer that is disposed between the substrate and the gate insulation layer; and a source electrode and a drain electrode that are connected with the semiconductor layer, wherein the semiconductor layer may include a channel region, and the gate electrode overlaps the channel region.

The OLED display may further include: a pixel electrode that is connected to the drain electrode; an organic emission layer that is disposed on the pixel electrode; and a common electrode that is disposed on the organic emission layer.

A thickness of the gate wire may be less than 3000 Å.

The OLED display may further include a gate capping layer that is disposed on the gate wire, wherein the gate capping layer may include titanium (Ti) or a titanium nitride (TiNx).

Edges of an upper surface of the gate electrode and edges of a bottom surface of the gate capping layer may match.

An according to an exemplary embodiment, a method for manufacturing an OLED display is provided. The method includes: forming a gate insulation layer on a substrate; and forming a gate insulation layer on a substrate; and wherein the forming the gate wire includes: sequentially forming a conductive layer that includes aluminum or an aluminum alloy and a photoresist layer; forming a primary gate pattern by primarily dry etching the conductive layer; and forming a secondary gate pattern by secondarily dry etching the primary gate pattern, wherein the primary dry etching and the secondary dry etching use a mixed gas that contains chlorine ($Cl_2$) and nitrogen (N).

The mixed gas may further contain boron trichloride ($BCl_3$) or argon (Ar). A content of nitrogen (N) in the mixed gas during the primarily dry etching may be different from that during the secondary dry etching.

The content of nitrogen (N) in the mixed gas during the primarily dry etching is less than that during the secondary dry etching In the primary dry etching, a content of nitrogen (N) in the mixed gas may be from about 10% to about 50%, and, in the secondary dry etching, a content of nitrogen (N) in the mixed gas may be from about 80% to about 90%.

A taper angle of the primary gate pattern may exceed 65°, and a taper angle of the secondary gate pattern may be less than 65°.

The gate insulation layer may contain a silicon oxide or a silicon nitride.

The forming the gate wire may further include forming an initial photoresist pattern by developing and exposing the photoresist layer, and a width of the initial photoresist pattern may match a width of a bottom surface of the gate wire.

A polymer layer that contains nitrogen (N) may be formed at side surfaces of each of the primary gate pattern and the secondary gate pattern.

A thickness of the gate wire may be less than 3000 Å.

The method for manufacturing the OLED display may further include forming a gate capping layer on the gate wire, wherein the gate capping layer may contain titanium (Ti) or a titanium nitride (TiNx).

A tertiary dry etching process is performed by using a gas that contains boron trichloride ($BCl_3$) or argon (Ar).

An etch selectivity of the photoresist layer to the aluminum or the aluminum alloy of the secondary dry etching may be greater than that of the primarily etching.

According to the exemplary embodiments, damage to the OLED display during a manufacturing process can be prevented, and high-resolution and high-speed driving of the OLED display can be enabled.

DETAILED DESCRIPTION OF THE EMBODIMENTS

Figure 1:
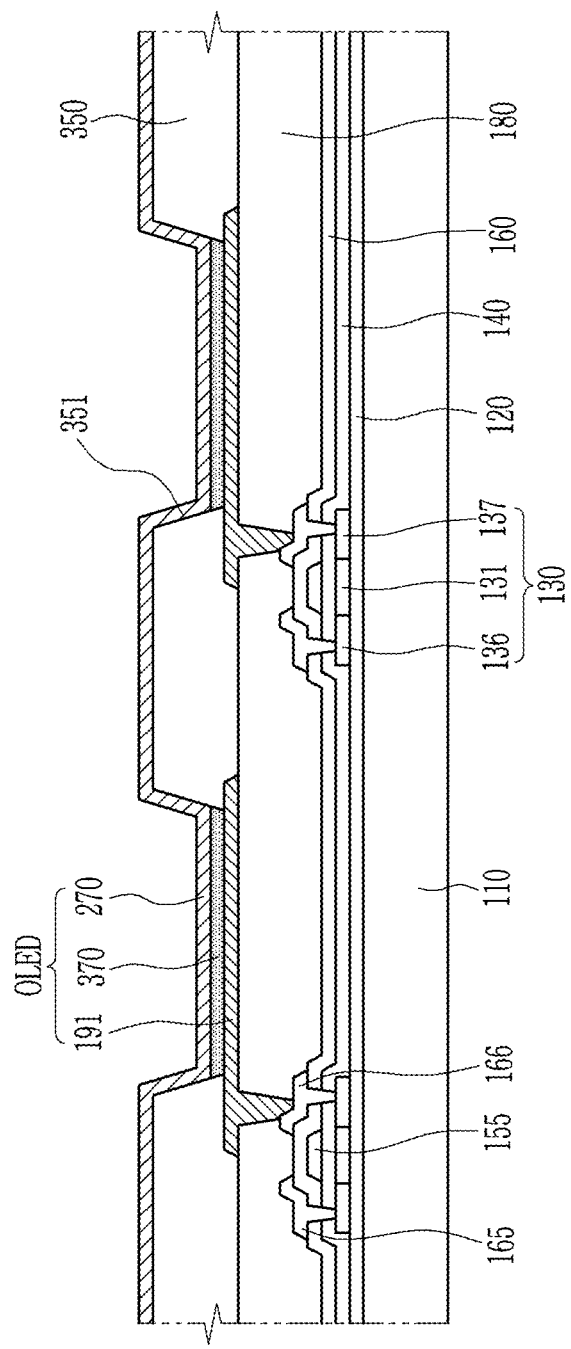
FIG. 1 is a cross-sectional view of an organic light emitting diode display according to an exemplary embodiment of the present inventive concept.

Hereinafter, the present inventive concept will be described more fully with reference to the accompanying drawings, in which exemplary embodiments of the inventive concept are shown. As those skilled in the art would realize, the described embodiments may be modified in various different ways, all without departing from the spirit or scope of the present inventive concept.

The drawings and description are to be regarded as illustrative in nature and not restrictive. Like reference numerals designate like elements throughout the specification.

Further, since a size and a thickness of each element illustrated in the drawings are arbitrarily illustrated for convenience of description, the present inventive concept is not necessarily limited to those shown in the drawings. In the drawings, the thickness of layers, films, panels, regions, etc., are exaggerated for clarity. In addition, in the drawing, for convenience of description, the thickness of some of layers, films, panels, regions, etc., are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

In addition, in this specification, the phrase "on a plane" means viewing a target portion from the top, and the phrase "on a cross-section" means viewing a cross-section formed by vertically cutting a target portion from the side.

Referring to FIG. 1, an organic light emitting diode display according to an exemplary embodiment of the present inventive concept will be described. FIG. 1 is a cross-sectional view of an organic light emitting diode display according to an exemplary embodiment of the present inventive concept.

Referring to FIG. 1, an organic light emitting diode display according to the present exemplary embodiment includes a substrate 110. The substrate 110 may include a flexible material while is bendable, foldable, and rollable, such as plastic and the like. For example, the substrate 110 may include polyimide (PI), polyethylene naphthalate (PEN), polycarbonate (PC), polyarylate (PAR), polyetherimide (PEI), polyether sulfone (PES), and the like.

A buffer layer 120 is disposed on the substrate 110. The buffer layer 120 may include an inorganic material such as a silicon nitride (SiNx) and a silicon oxide (SiO$_2$). The buffer layer 120 is disposed between the substrate 110 and semiconductor layers 130, which will be described later, and improves a quality of polysilicon by blocking an impurity from the substrate 110 during a crystallization process for forming the polysilicon and releases stress of the semiconductor layer 130 formed on the buffer layer 120 by planarizing the substrate 110.

The semiconductor layers 130 are disposed on the buffer layer 120. Each semiconductor layer 130 may be formed of polysilicon or an oxide semiconductor.

The semiconductor layer 130 may be formed of polysilicon, and includes a channel region 131, a source region 136, and a drain region 137. The source region 136 and the drain region 137 are respectively disposed at opposite sides of the channel region 131. The channel region 131 is an intrinsic semiconductor where an impurity is not doped, and the source region 136 and the drain region 137 are impurity semiconductors where a conductive impurity is doped. The semiconductor layer 130 may be formed of an oxide semiconductor, and in this case, an additional protective layer may be included to protect an oxide semiconductor material that is weak to an external environment such as a high temperature and the like.

A gate insulation layer 140 is disposed on the semiconductor layer 130 to cover the same. The gate insulation layer 140 may be a single layer or a multi-layer including at least one of a silicon nitride (SiNx) and a silicon oxide (SiO$_2$).

Gate electrodes 155 are disposed on the gate insulation layer 140. Each gate electrode 155 is disposed to overlap the channel region 131 of the semiconductor layer 130. The gate electrode 155 may have a trapezoidal shape of which a lower width is larger than an upper width in a cross-sectional view. A bottom surface of each gate electrode 155 may match an area that corresponds to the channel region 131 of each semiconductor layer 130.

The gate electrode 155 is formed of a single layer of aluminum (Al) or an aluminum alloy. Aluminum (Al) has lower electrical resistance (Ω) than molybdenum (Mo). In the organic light emitting diode (OLED) display according to the present exemplary embodiment, the gate electrode 155 includes a single layer of aluminum (Al) or an aluminum alloy, and thus resistance is low enough even through a thickness of the gate electrode 155 is thin, thereby transmitting a signal quickly. When the thickness is the same, the signal transmission speed of the gate electrode including a single layer of aluminum (Al) or an aluminum alloy is higher than that of the gate electrode including molybdenum (Mo), and thus the OLED display can be driven at a high speed.

The gate electrode 155 may have a thickness of less than 3000 Å. When the thickness of the gate electrode 155 is 3000 Å or exceeds 3000 Å, a pressure is locally applied to an area where the gate electrode 155 is disposed and thus a glass substrate attached for the post process may be damaged.

A taper angle of the gate electrode 155 is equal to 65° or less. The taper angle implies an angle formed by a side surface of the gate electrode 155 and the gate insulation layer 140. When the taper angle of the gate electrode 155 exceeds 65°, an inorganic insulation layer formed above the gate electrode 155 may be disconnected or wirings formed above the gate electrode 155 and the gate electrode 155 may be short-circuited. However, in the organic light emitting diode display according to the present exemplary embodiment, the taper angle of the gate electrode 155 is equal to or less than 65°, and accordingly a defect, which may occur due to the taper angle of the gate electrode 155, can be prevented.

The organic light emitting diode display according to the present exemplary embodiment includes a gate wire that transmits a gate signal and a data wire (not shown) that transmits a data signal. In FIG. 1, the gate electrode 155 is illustrated as an example of the gate wire, but this is not restrictive. A feature of the above-stated gate electrode 155 can be applied at any portion in the gate wire that transmits the gate signal.

An interlayer insulation layer 160 is disposed on the gate electrode 155 and the gate insulation layer 140. The interlayer insulation layer 160 may include a silicon nitride (SiNx) or a silicon oxide ($SiO_2$). Openings that respectively expose the source region 136 and the drain region 137 of the semiconductor layer 130 are respectively disposed in the gate insulation layer 140 and the interlayer insulation layer 160.

A source electrode 165 and a drain electrode 166 are disposed on the interlayer insulation layer 160. The source electrode 165 and the drain electrode 166 are respectively connected with the source region 136 and the drain region 137 of the semiconductor layer 130 through the openings that are respectively formed in the interlayer insulation layer 160 and the gate insulation layer 140.

A passivation layer 180 is disposed on the interlayer insulation layer 160, the source electrode 165, and the drain electrode 166. The passivation layer 180 planarizes steps formed by the interlayer insulation layer 160, the source electrode 165, and the drain electrode 166 by covering them, and thus a pixel electrode 191 can be formed on the passivation layer 180 without a step difference. The passivation layer 180 may be formed of an organic material such as a polyacrylate resin, a polyimide resin, or a stacked layer of an organic material and an inorganic material.

The pixel electrode 191 is disposed on the protective layer 180. The pixel electrode 191 is connected with the drain electrode 166 through an opening formed in the passivation layer 180.

A driving transistor formed of the gate electrode 155, the semiconductor layer 130, the source electrode 165, and the drain electrode 166 is connected to the pixel electrode 191 and supplies a driving current to an organic light emitting diode (OLED). The organic light emitting diode display according to the present exemplary embodiment may further include a switching transistor (not shown) that is connected with a data line and transmits a data voltage in response to a scan signal, and a compensation transistor (not shown) that is connected with the driving transistor and compensates a threshold voltage of the driving transistor in response to the scan signal.

A partition wall 350 is disposed on the passivation layer 180 and the pixel electrode 191 to cover them, and the partition wall 350 includes a pixel opening 351 that exposes the pixel electrode 191. The partition wall 350 may include an organic material such as a polyacrylate resin, a polyimide resin, and the like, or a silica-based inorganic material.

An organic emission layer 370 is disposed on a portion of the pixel electrode 191 that is exposed by the pixel opening 351. The organic emission layer 370 may be formed of a low molecular weight organic material or a high molecular weight organic material such as PEDOT (poly(3,4-ethylenedioxythiophene)). In addition, the organic emission layer 370 may be a multilayer including at least one of a functional layer such as a hole injection layer (HIL), a hole transport layer (HTL), an electron transport layer (ETL) and an electron injection layer (EIL).

The organic emission layer 370 may include a red organic emission layer, a green organic emission layer, and a blue organic emission layer. The red organic emission layer, the green organic emission layer, and the blue organic emission layer respectively emit red light, green light, and blue light such that a colored image can be realized.

A common electrode 270 is disposed on the organic emission layer 370. The common electrode 270 may be disposed over a plurality of pixels. The pixel electrode 191, the organic emission layer 370, and the common electrode 270 may form the organic light emitting diode (OLED).

Here, the pixel electrode 191 may be an anode, which is a hole injection electrode, and the common electrode 270 may be a cathode, which is an electron injection electrode. However, the present exemplary embodiment is not limited thereto, and the pixel electrode 191 may be a cathode and the common electrode 270 may be an anode depending on a driving method of the organic light emitting diode display. The hole and electron are injected into the organic emission layer 370 from the pixel electrode 191 and the common electrode 270, respectively, and an exciton generated by coupling the injected hole and electron falls from an excited state to a ground state to emit light.

An encapsulation layer (not shown) may be further disposed on the common electrode 270. The encapsulation layer may include a plurality of layers, and may be formed as a complex layer including both an inorganic layer and an organic layer, or may be formed as a triple layer in which an inorganic layer, an organic layer, and an inorganic layer are sequentially stacked.

Figure 2:
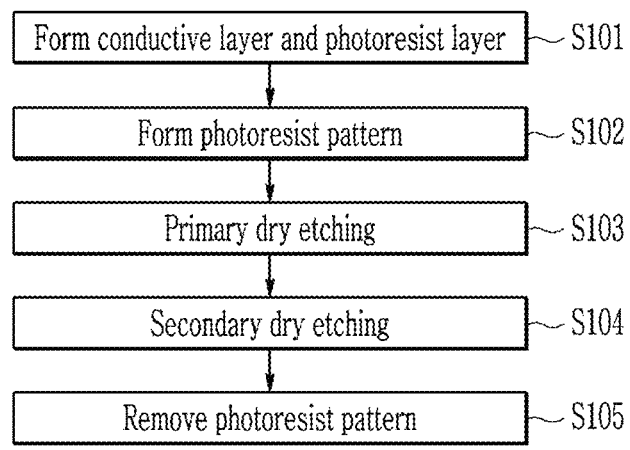
FIG. 2 is a flowchart of a method for manufacturing an organic light emitting diode display according to an exemplary embodiment.

Hereinafter, a method for manufacturing an organic light emitting diode display according to an exemplary embodiment will be described with reference to FIG. 2 to FIG. 7. FIG. 2 is a flowchart of a method for manufacturing an organic light emitting diode display according to an exemplary embodiment.

Referring to FIG. 2, a method for manufacturing an organic light emitting diode display according to an exemplary embodiment includes sequentially forming a conductive layer and a photoresist layer on a gate insulation layer (S101). The conductive layer is formed as a single layer of aluminum (Al) or an aluminum alloy. Next, a photoresist pattern is formed by exposing and developing the photoresist layer by using a photomask (S102). The photoresist layer may be formed as a positive or negative type of resist. Next, primary dry etching is carried out by using a mixed gas containing 10% to 50% of nitrogen (N)(S103). After the primary dry etching is carried out, secondary dry etching is carried out by using a mixed gas containing 80% to 90% of nitrogen (N) and applying a predetermined electrical power (S104). Through the two dry etching processes, a gate wiring pattern is formed. After the gate wiring pattern is formed, a residual photoresist pattern is removed (S105), and a subsequent process is carried out to complete an organic light emitting diode display.

FIG. 3 to FIG. 7 are cross-sectional views of each process of the manufacturing method of the organic light emitting diode display according to the exemplary embodiment.

Figure 3:
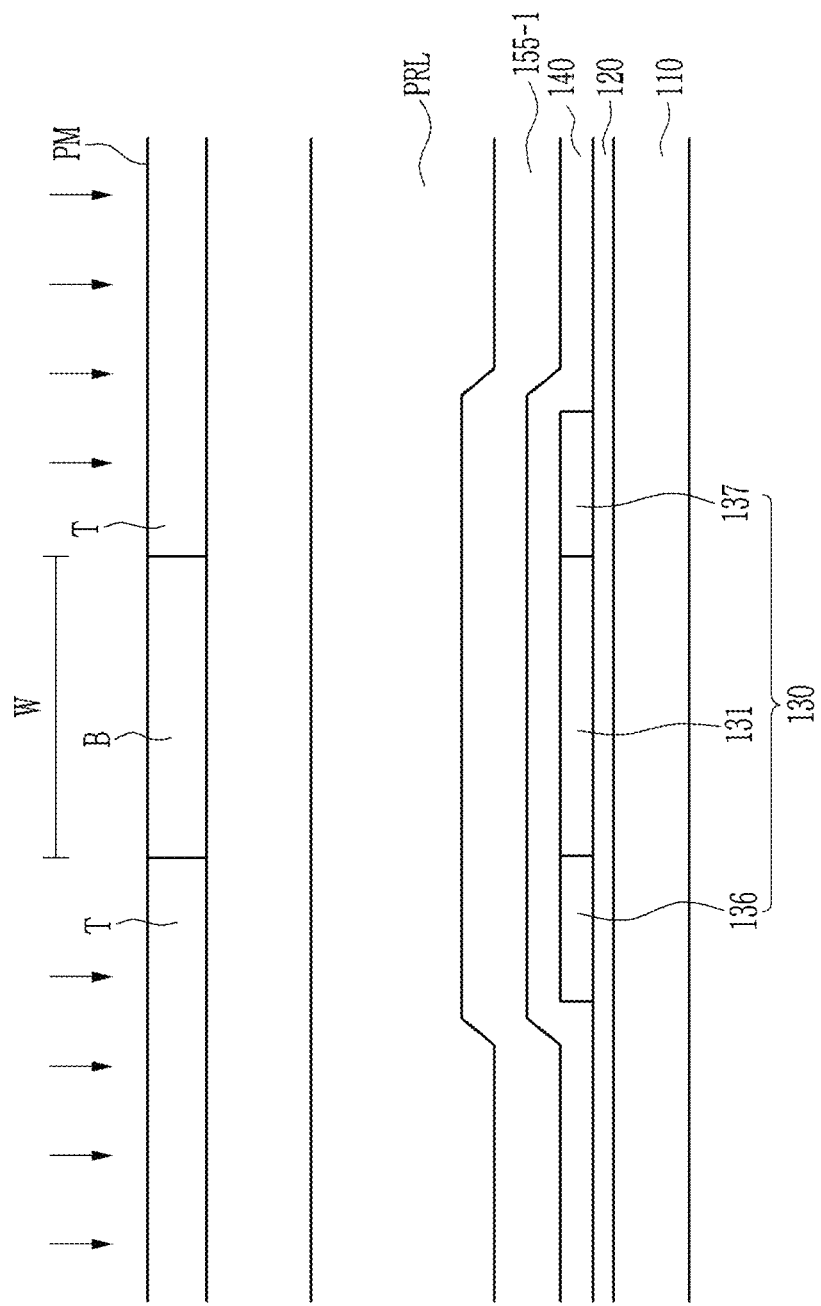
FIGS. 3, 4, 5, 6 and 7 are cross-sectional views of each process of the manufacturing method of the organic light emitting diode display according to the exemplary embodiment.

Referring to FIG. 3, a conductive layer 155-1 and a photoresist layer PRL, for example, a positive photoresist layer, are sequentially formed on a gate insulation layer 140. The conductive layer 155-1 includes a single layer of aluminum (Al) or an aluminum alloy. When aluminum (Al) is included, resistance is low compared to a case in which molybdenum (Mo) is included. Thus, a wire formed of aluminum (Al) has a faster signal transmission speed than a wire formed of molybdenum (Mo) having the same thickness, and accordingly, the organic light emitting diode display can be driven at a high speed.

A photomask PM having a transmission portion T and a light blocking portion B on the photoresist layer PRL is disposed on the photoresist layer PRL, and light is applied to the photomask PM to expose and develop the photoresist layer PRL.

When the photoresist layer PRL is a positive-type resist, an exposed portion of the photoresist layer PRL is removed. In this case, the photomask PM has the blocking portion B in a portion that corresponds to a portion where a gate wire will be formed. On the other hand, when the photoresist layer PRL is provided as a negative-type resist, an exposed portion of the photoresist PRL remains. In this case, the photomask PM includes the transmission portion T in a portion that corresponds to a portion where a gate wire will be formed.

Figure 4:
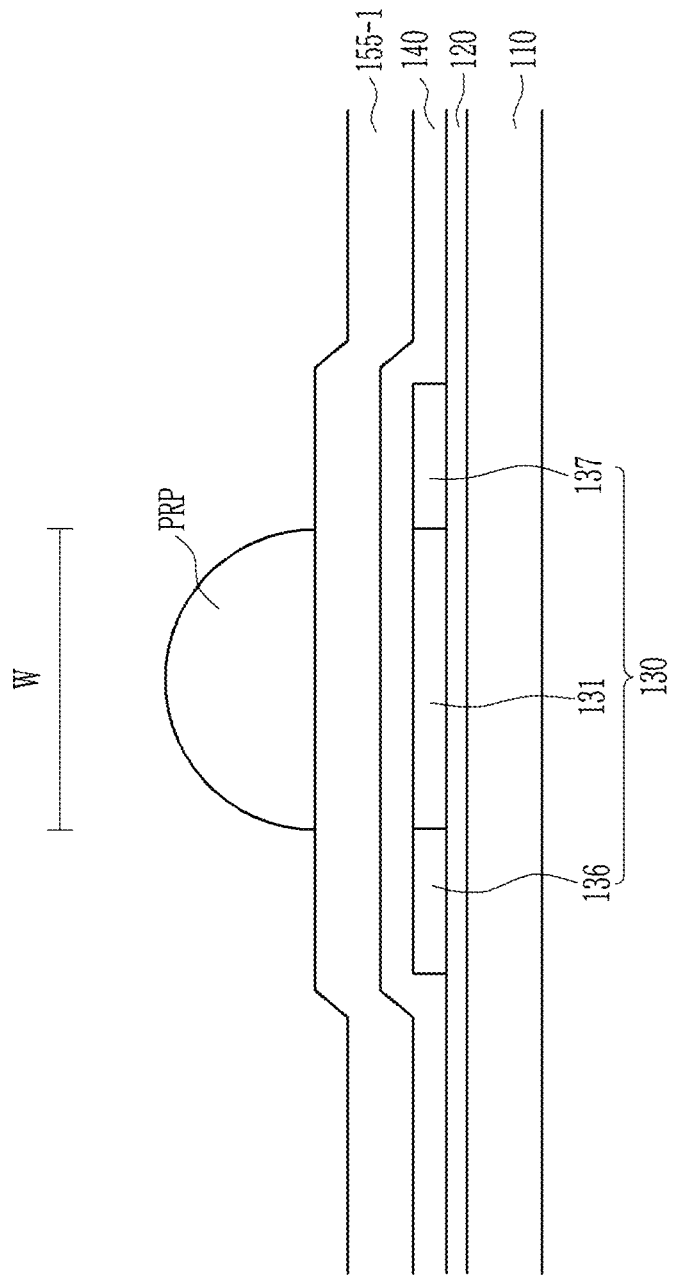

Referring to FIG. 4, the photoresist layer PRL of FIG. 3 is exposed and developed such that a photoresist pattern PRP is formed. An area where the photoresist pattern PRP is disposed is an area that corresponds to the portion where the gate wire is formed. A width W of the photoresist pattern that is initially formed before an etching process is carried out may be the same as a width of the portion where the gate wire is formed.

Figure 5:
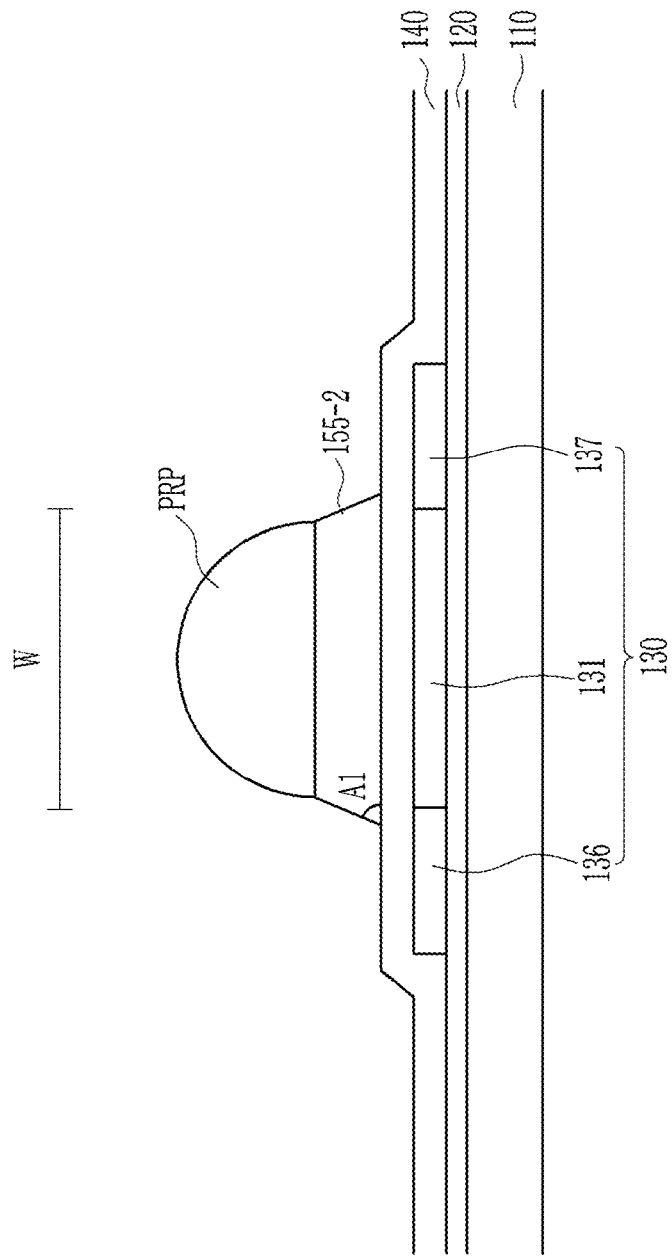

Referring to FIG. 5, primary dry etching is carried out on the conductive layer 155-1 of FIG. 4 such that a primary gate pattern 155-2 is formed. In the primary dry etching process, a mixed gas containing boron trichloride ($BCl_3$), chlorine ($Cl_2$), and nitrogen (N) is used. In the primary dry etching process, boron trichloride ($BCl_3$) may be replaced with argon (Ar).

An amount of nitrogen N in the mixed gas may be from about 10% to about 50%. The primary dry etching may be carried under a pressure of about 10 mTorr to 30 mTorr. Through the primary dry etching, a polymer layer that includes nitrogen (N) of the mixed gas and carbon (C) of the photoresist pattern PRP is formed at a side surface of the conductive layer 155-1. Since the side surface of the conductive layer 155-1 is protected by the polymer layer, an undercut does not occur in the primary gate pattern 155-2 that includes aluminum (Al) or an aluminum alloy.

A width of a bottom side of the primary gate pattern 155-2 formed by the primary dry etching is larger than the width W of the initial photoresist pattern before the primary dry etching. The surface of the photoresist pattern PRP is also partially etched by the primary dry etching. Accordingly, the width of the photoresist pattern PRP becomes smaller than the width W of the initial photoresist pattern after the primary dry etching.

The shape of a cross-section of the primary gate pattern 155-2 may be trapezoidal of which a lower width is larger than an upper width. When a mixed gas that has a nitrogen (N) content of 10% to 50% is primarily used for dry-etching, an etching ratio of aluminum (Al) is larger than that of the photoresist material. That is, an etching rate of the conductive layer 155-1 that includes aluminum (Al) is higher than the retraction speed of the photoresist pattern PRP. In this case, the retraction speed represents an etching speed of the photoresist pattern PRP.

As a result, a taper angle A1 formed by the side surface of the primary gate pattern 155-2 and the gate insulation layer 140 exceeds 65°, and thus the side surfaces of the primary gate pattern 155-2 become steep.

In the primary dry etching process, a dry etching process using a gas containing boron trichloride ($BCl_3$) and a dry etching process using a mixed gas containing chlorine ($Cl_2$) and nitrogen (N) may be individually carried out. In other words, the primary dry etching process may use a mixed gas containing chlorine ($Cl_2$) and nitrogen (N) and a tertiary dry etching process using a gas containing boron trichloride ($BCl_3$) may be carried out. In addition, in the tertiary dry etching process, boron trichloride ($BCl_3$) may be replaced with argon (Ar).

Figure 6:
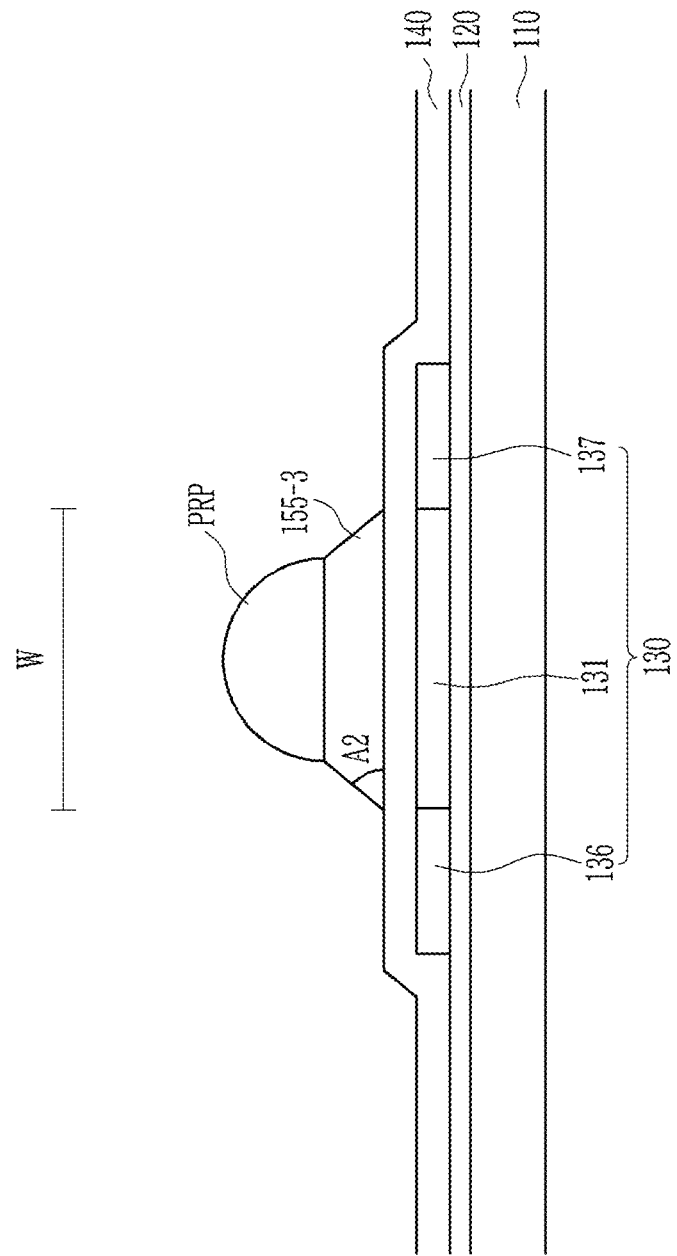

Referring to FIG. 6, a secondary gate pattern 155-3 is formed by performing secondary dry etching on the primary gate pattern 155-2 of FIG. 5. The secondary dry etching may be carried out through reactivity ion etching (RIE). A mixed gas used in the secondary dry etching contains boron trichloride ($BCl_3$), chlorine ($Cl_2$), and nitrogen (N). A content ratio of nitrogen (N) in the mixed gas may be from about 80% to about 90%. When the secondary dry etching is carried out, a predetermined electrical power may be applied. For example, an electrical power of 500 W to 2000 W may be applied. However, the intensity of the electrical power is not limited thereto, and may be less than 500 W or over 2000 W depending on the size of an object to be etched. In addition, the secondary dry etching may be carried out under a pressure of about 10 mTorr to 30 mTorr.

The shape of a cross-section of the secondary gate pattern 155-3 may be trapezoidal of which a lower width is larger than an upper width. When the secondary dry etching is carried by using a mixed gas having a nitrogen content of 80% to 90% is carried by applying a predetermined electrical power, an etching ratio of the photoresist material is larger than that of aluminum (Al). That is, the retraction speed of the photoresist pattern PRP is higher than an etching rate of the primary gate pattern 155-2 that contains aluminum (Al). As a result, a taper angle A2 formed by the side surface of the secondary gate pattern 155-3 and the gate insulation layer 140 is less than 65°, and thus the side surfaces of the secondary gate pattern 155-3 become not steep. Since a taper angle of a gate wire does not exceed 65°, a defect which may occur due to disconnection or short-circuit of an inorganic layer or a wire that is stacked in the next process may be prevented.

A width of a bottom side of the secondary gate pattern 155-3 formed by the secondary dry etching may be equal to the width W of the initial photoresist pattern. The surface of the photoresist pattern PRP is also partially etched by the secondary dry etching. Accordingly, the width of the photoresist pattern PRP after the secondary dry etching becomes smaller than the width of the photoresist pattern PRP after the primary dry etching.

Figure 7:
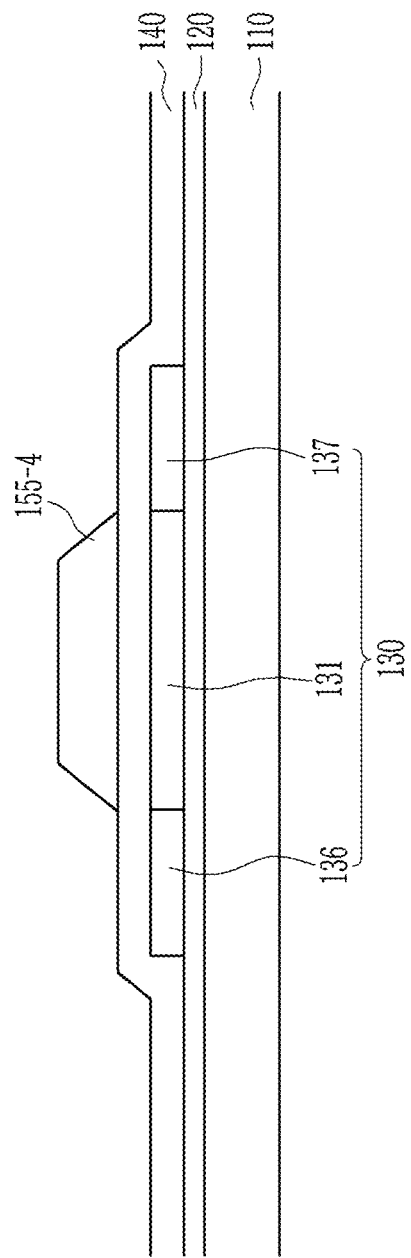

Referring to FIG. 7, a residual photoresist pattern PRP and a polymer layer formed at the side surfaces of the secondary gate pattern 155-3 may be removed by ashing. However, this is not restrictive, and any method that can remove the photoresist pattern PRP is applicable. Accordingly, a gate wire 155-4 having a taper angle of 65° or less is formed.

Figure 8:
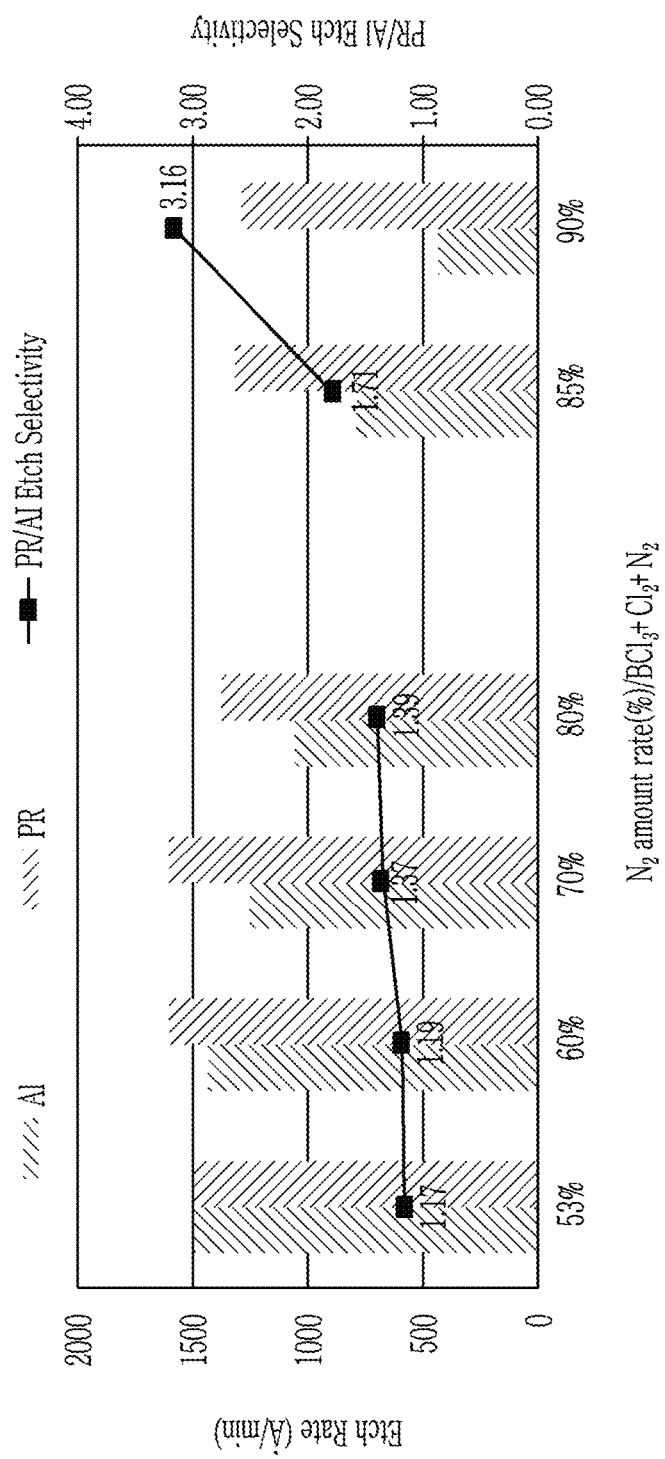
FIG. 8 is a graph that shows etching selectivity of aluminum (Al) and the photoresist material PR depending on a content of nitrogen (N).

FIG. 8 is a graph that shows etching selectivity of aluminum (Al) and the photoresist material PR depending on a content of nitrogen (N). The content of nitrogen (N) implies a content ratio of nitrogen (N) in the mixed gas.

Referring to FIG. 8, it can be observed that the PR/A1 etch selectivity of the photoresist material PR to aluminum (Al) is increased as the content of nitrogen (N) in the mixed gas is increased. Thus, in the secondary dry etching process in which a content of nitrogen (N) is 80% to 90%, the photoresist pattern is etched faster than a gate pattern containing aluminum (Al). Accordingly, it is possible to form a small taper angle.

In a case that a gate wire of the organic light emitting diode display contains molybdenum (Mo), etch selectivity of the photoresist material and molybdenum (Mo) can be adjusted by using a mixed gas containing oxygen ($O_2$) in the etching process. However, when the gate wire includes aluminum (Al), aluminum (Al) reacts with oxygen ($O_2$) and thus $AlO_x$ particles are generated, and accordingly oxygen ($O_2$) cannot be used. According to the exemplary embodiment of the present inventive concept, etch selectivity of the photoresist material and aluminum (Al) can be adjusted by etching using nitrogen ($N_2$) as an ambient gas.

Figure 9:
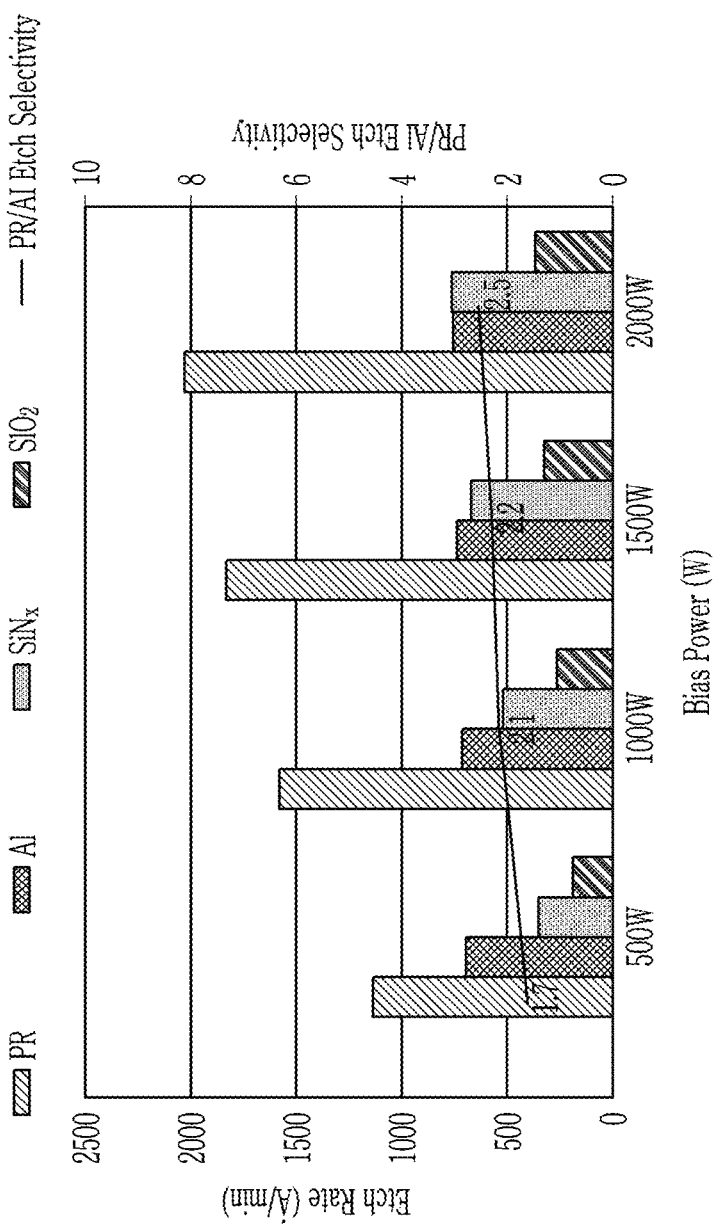
FIG. 9 is a graph that shows an etching ratio of each material depending on applied electrical power.

FIG. 9 is a graph that shows an etching ratio of each material depending on an applied electrical power (bias power). Specifically, FIG. 9 shows an etch rate of each of the photoresist material PR, aluminum (Al), a silicon nitride (SiNx), and a silicon oxide ($SiO_2$), and PR/Al etch selectivity of the photoresist material PR to aluminum (Al) when a content of nitrogen (N) in the mixed gas is 85%.

Referring to FIG. 9, the etch rate of the photoresist material PR and the etch selectivity of the photoresist material PR to aluminum (Al) are increased as the applied power is increased. Thus, in the secondary dry etching performed with nitrogen (N) content of 80% to 90% and a predetermined electrical power applied thereto, etching of the photoresist pattern PRP occurs faster than the primary gate pattern 155-2 that includes aluminum (Al). When the photoresist pattern PRP retracts rapidly, the upper surface of edge of the gate wire may be exposed to the mixed gas and side surfaces of the gate wire may be more smoothly formed, such that a taper angle formed by the side surfaces of the gate wire and the gate insulation layer may be formed to be small. In addition, a desired taper angle of the gate wire can be realized by adjusting the applied electrical power.

Figure 10:
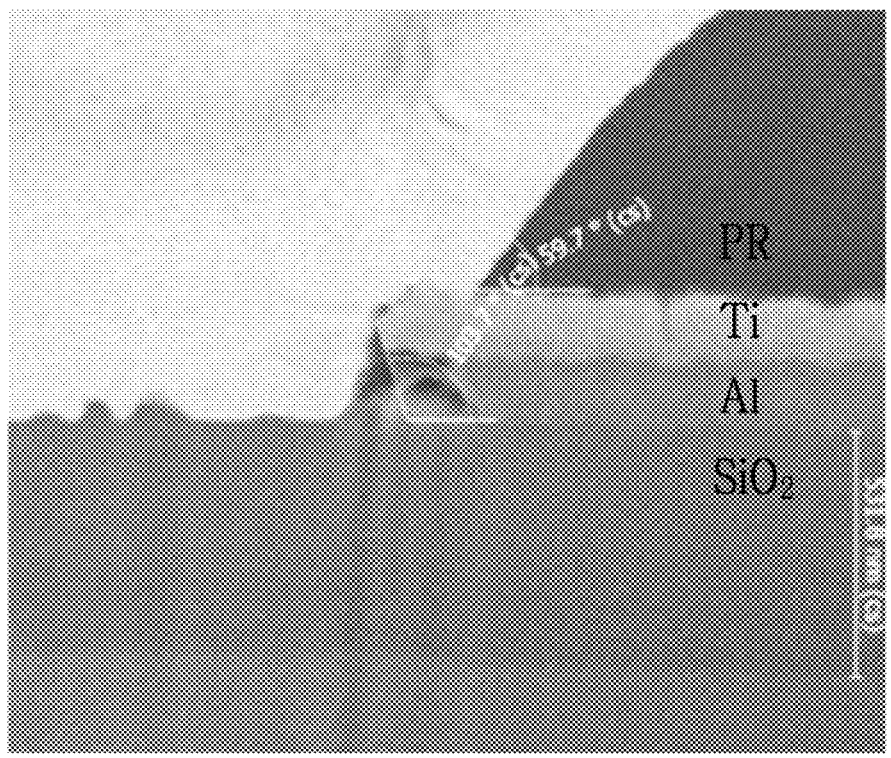
FIG. 10 is an image of a comparative example.

FIG. 10 is an image of a comparative example. FIG. 10 shows a cross-section of an aluminum wire that is formed on a silicon oxide ($SiO_2$) by performing dry-etching using a mixed gas of boron trichloride ($BCl_3$) and chlorine ($Cl_2$). Referring to FIG. 10, when dry-etching is carried out by using a mixed gas which does not contain nitrogen (N), a bottom portion of the aluminum wire is excessively etched, thereby causing an under-cut.

Figure 11:
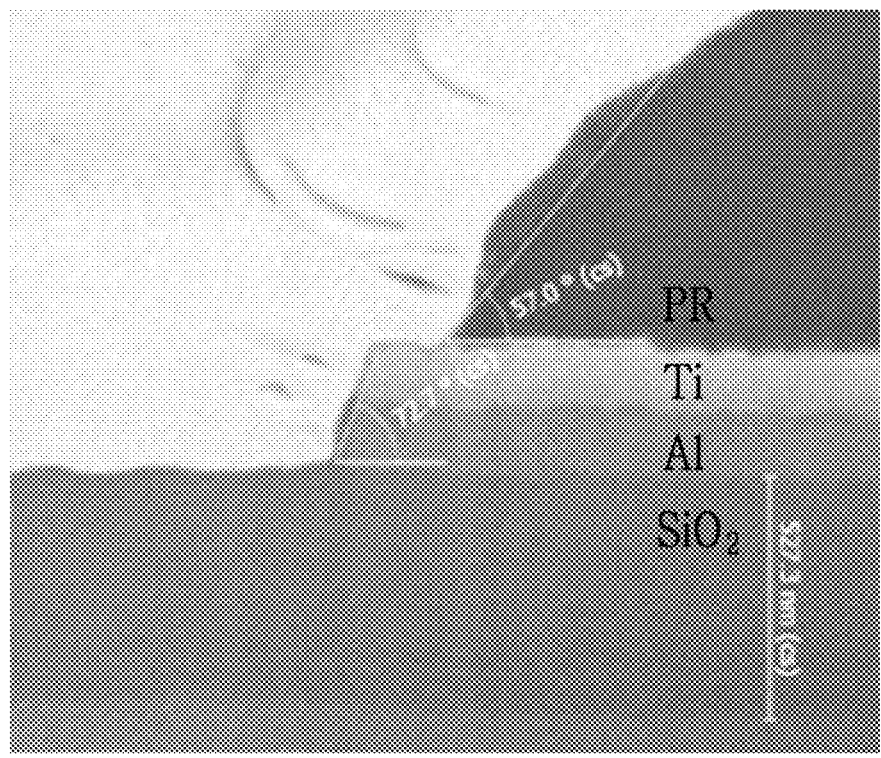
FIG. 11 is an image of an aluminum wire after primary dry-etching.

FIG. 11 is an image of an aluminum wire after primary dry-etching. In FIG. 11, an aluminum wire was formed on a silicon oxide ($SiO_2$) by performing dry-etching using a mixed gas that contained boron trichloride ($BCl_3$), chlorine ($Cl_2$), and nitrogen (N) with a content of 10% to 50%. In this case, unlike the comparative example of FIG. 10, under-cut did not occur in a bottom portion of the aluminum wire. This is because a polymer layer that includes nitrogen (N) in the mixed gas and carbon (C) having a photoresist pattern is formed at side surfaces of the aluminum wire, thereby protecting the side surfaces of the aluminum wire.

Referring to FIG. 11, a taper angle of the aluminum wire was as steep as 72.7°. This is because, as described above, when dry-etching is performed by using a mixed gas having nitrogen content of 10% to 50%, an etching rate of aluminum (Al) is larger than that of the photoresist material.

Figure 12:
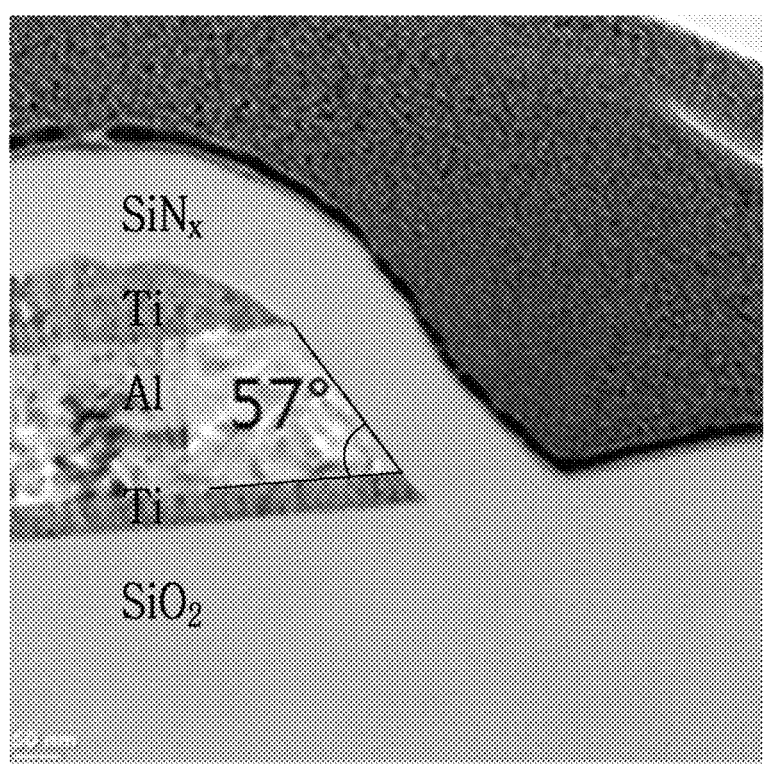
FIG. 12 is an image of an aluminum wire after secondary dry etching.

FIG. 12 is an image of an aluminum wire after secondary dry etching. In FIG. 12, an aluminum wire is formed on a silicon oxide ($SiO_2$) by performing dry-etching using a mixed gas that contains boron trichloride ($BCl_3$), chlorine ($Cl_2$), and nitrogen (N) with a content of 80% to 90% and application of electrical power of 500 W to 200 W.

In FIG. 12, a taper angle of the aluminum wire is 57°. Thus, compared to the comparative example of FIG. 11, the taper angle of the aluminum wire was formed as small as less than 65°. This is because, when the dry-etching is performed by using a mixed gas having nitrogen content of 80% to 90% and applying a predetermined electrical power, an etching rate of aluminum (Al) is smaller than that of the photoresist material.

Figure 13:
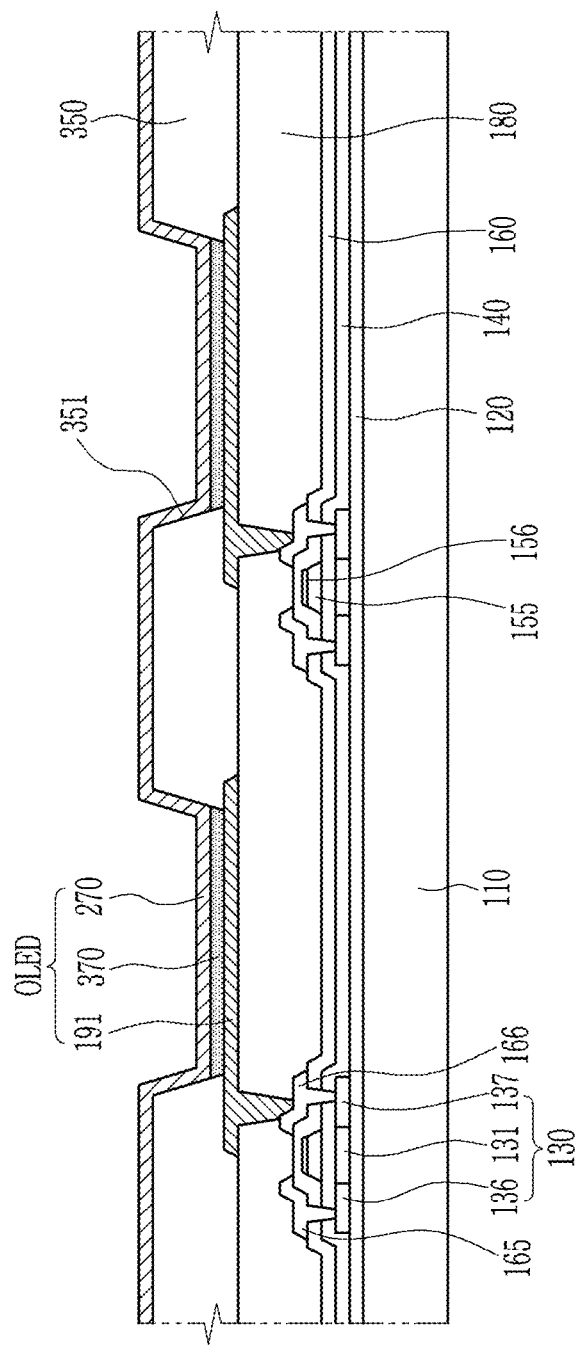
FIG. 13 is a cross-sectional view of an OLED display according to another exemplary embodiment.

FIG. 13 is a cross-sectional view of an OLED display according to another exemplary embodiment. Description of the constituent elements that are the same as those in FIG. 1 will be omitted. Unlike the OLED display of FIG. 1, the OLED display FIG. 13 further includes a gate capping layer 156 on a gate electrode 155.

The gate electrode 155 includes aluminum (Al) or an aluminum alloy. The gate capping layer 156 includes titanium (Ti) or a titanium nitride (TiNx). The gate capping layer 156 can prevent the gate electrode 155 formed of aluminum (Al) from being damaged due to a buffered oxide etching (BOE) solution that is used in the next process.

Although the gate capping layer 156 is described as being disposed on the gate electrode 155, it is not limited thereto. Referring to FIG. 12, the gate capping layer 156 may be disposed under the gate electrode 155, or the gate capping layer 156 may be disposed on and under the gate electrode 155.

The gate electrode 155 and the gate capping layer 156 of the OLED display according to the present exemplary embodiment may be formed by sequentially stacking a single layer of aluminum (Al) or an aluminum alloy and a layer that includes titanium (Ti) or a titanium nitride (TiNx), primarily dry-etching the two layers together, and then secondarily dry-etching the primarily dry-etched two electrodes. Accordingly, the gate electrode 155 and the gate capping layer 156 overlap each other, and edges of an upper surface of the gate electrode 155 and edges of a bottom surface of the gate capping layer 156 may match.

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A method for manufacturing an organic light emitting diode (OLED) display, comprising:
   forming a gate insulation layer on a substrate; and
   forming a gate wire on the gate insulation layer,
   wherein the forming the gate wire comprises:
   sequentially forming a conductive layer that includes aluminum or an aluminum alloy and a photoresist layer;
   forming a primary gate pattern by primarily dry etching the conductive layer; and
   forming a secondary gate pattern by secondarily dry etching the primary gate pattern,
   wherein the primary dry etching and the secondary dry etching use a mixed gas that contains chlorine (C12) and nitrogen (N).

2. The method for manufacturing the OLED display of claim 1, wherein the mixed gas further contains boron trichloride (BC13) or argon (Ar).

3. The method for manufacturing the OLED display of claim 1, wherein a content of nitrogen (N) in the mixed gas during the primarily dry etching is different from that during the secondary dry etching.

4. The method for manufacturing the OLED display of claim 3 wherein the content of nitrogen (N) in the mixed gas during the primarily dry etching is less than that during the secondary dry etching.

5. The method for manufacturing the OLED display of claim 4, wherein, in the primary dry etching, a content of nitrogen (N) in the mixed gas is from about 10% to about 50%, and
in the secondary dry etching, a content of nitrogen (N) in the mixed gas is 80% to 90%.

6. The method for manufacturing the OLED display of claim 5, wherein
a taper angle of the primary gate pattern exceeds 65°, and
a taper angle of the secondary gate pattern is less than 65°.

7. The method for manufacturing the OLED display of claim 6, wherein the gate insulation layer contains a silicon oxide (SiO2) or a silicon nitride (SiNx).

8. The method for manufacturing the OLED display of claim 7, wherein the forming the gate wire further comprises forming an initial photoresist pattern by developing and exposing the photoresist layer, and
a width of the initial photoresist pattern matches a width of a bottom surface of the gate wire.

9. The method for manufacturing the OLED display of claim 8, wherein a polymer layer that contains nitrogen (N) is formed at side surfaces of each of the primary gate pattern and the secondary gate pattern.

10. The method for manufacturing the OLED display of claim 9, wherein a thickness of the gate wire is less than 3000 Å.

11. The method for manufacturing the OLED display of claim 6, further comprising forming a gate capping layer on the gate wire,
wherein the gate capping layer contains titanium (Ti) or a titanium nitride (TiNx).

12. The method for manufacturing the OLED display of claim 1, further comprising a tertiary dry etching process performed by using a gas that contains boron trichloride (BCl3) or argon (Ar).

13. The method for manufacturing the OLED display of claim 1, wherein an etch selectivity of the photoresist layer to the aluminum or the aluminum alloy of the secondary dry etching is greater than that of the primarily etching.

* * * * *